United States Patent [19]
Carley et al.

[11] Patent Number: 5,717,631
[45] Date of Patent: Feb. 10, 1998

[54] MICROELECTROMECHANICAL STRUCTURE AND PROCESS OF MAKING SAME

[75] Inventors: L. Richard Carley, Sewickley; Michael L. Reed, Pittsburgh; Gary K. Fedder, Pittsburgh; Suresh Santhanam, Pittsburgh, all of Pa.

[73] Assignee: Carnegie Mellon University, Pittsburgh, Pa.

[21] Appl. No.: 507,676

[22] Filed: Jul. 25, 1995

Related U.S. Application Data

[63] Continuation-in-part of Ser. No. 505,836, Jul. 21, 1995.
[51] Int. Cl.$^6$ ................................................ H01L 21/44
[52] U.S. Cl. .................... 365/174; 369/126; 369/127; 437/69; 437/72; 437/80; 437/225; 437/228
[58] Field of Search .................. 437/190, 69, 72, 437/80, 225, 228; 156/643; 29/25.35; 369/126, 127; 365/174

[56] References Cited

U.S. PATENT DOCUMENTS

| | | | |
|---|---|---|---|
| 4,668,865 | 5/1987 | Gimzewski et al. | |
| 4,687,544 | 8/1987 | Bersin | 156/643 |
| 4,912,822 | 4/1990 | Zdeblick et al. | 29/25.35 |
| 5,036,490 | 7/1991 | Kajimura et al. | |
| 5,049,775 | 9/1991 | Smits | 310/328 |
| 5,082,801 | 1/1992 | Nagata | 437/190 |
| 5,173,151 | 12/1992 | Namose | 156/643 |
| 5,216,631 | 6/1993 | Sliwa, Jr. | |
| 5,235,187 | 8/1993 | Arney et al. | |
| 5,310,624 | 5/1994 | Ehrlich | 430/322 |
| 5,375,033 | 12/1994 | MacDonald | |
| 5,396,066 | 3/1995 | Ikeda et al. | |

FOREIGN PATENT DOCUMENTS

| | | |
|---|---|---|
| 0 363 550 A1 | 4/1990 | European Pat. Off. |
| 0 452 852 A2 | 10/1991 | European Pat. Off. |
| 0 452 852 A3 | 10/1991 | European Pat. Off. |
| 0 472 342 A2 | 2/1992 | European Pat. Off. |
| 0 518 283 A2 | 12/1992 | European Pat. Off. |
| 0 518 283 A3 | 12/1992 | European Pat. Off. |
| 0 530 427 A1 | 3/1993 | European Pat. Off. |
| 4115103 | 4/1992 | Japan . |
| 4205828 | 7/1992 | Japan . |
| 7021598 | 1/1995 | Japan . |
| WO 96/11472 A2 | 4/1996 | WIPO . |
| WO 96/11472 A3 | 4/1996 | WIPO . |

OTHER PUBLICATIONS

O. Watanuki et al., Small Magnet Patterns Written With A Scanning Tunneling Microscope, IEEE Transactions On Magnetics, vol. 27, No. 6, Nov. 1991.

P. N. Louskinovich et al., Nanoelectronics Based on Scanning Tunneling Microscopy, ISSCC 92/Session 8/Engineering Technologies/Paper 8.7.

T. R. Albrecht et al., Nanometer-Scale Hole Formation on Graphite Using a Scanning Tunneling Microscope, Appl. Phys. Lett. 55(17).23 Oct. 1989.

*Primary Examiner*—Viet Q. Nguyen
*Attorney, Agent, or Firm*—Kirkpatrick & Lockhart LLP

[57] ABSTRACT

A microelectromechanical device is comprised of a cantilevered beam positioned above, and free to move relative to, a substrate. The beam may carry a plurality of conductors which are insulated from one another. One or more tips is positioned on the beam with each tip being in electrical contact with one of the conductors. A memory device may be constructed by providing an array of such cantilevered beams proximate to a layer of media. Devices for positioning the beam in x and y directions perpendicular to each other and parallel to the layer of media and in a z direction perpendicular to the media are provided. A control circuit generates control signals input to the positioning devices for positioning the tips according to x, y, and z coordinates. A read/write circuit which is in electrical communication with the conductors of the beam, provide signals to the tips to cause the tips to write those signals to the layer of media in a write mode and to read previously written signals sensed by the tips in a read mode. A fabrication method is also disclosed.

9 Claims, 5 Drawing Sheets

MICROELECTROMECHANICAL STRUCTURE AND PROCESS OF MAKING SAME

This is a continuation-in-part of application Ser. No. 08/505,836 filed on Jul. 21, 1995 entitled "Microelectromechanical Structure and Process of Making Same".

BACKGROUND OF THE INVENTION

1. Field of the Invention

The present invention is directed broadly to microelectromechanical systems (MEMS) and more particularly to a microelectromechanical structure which is particularly useful for data storage applications.

2. Description of the Background

The ability of scanning tunneling microscopy ("STM") to modify surfaces on a nanometer scale has been demonstrated in a variety of experiments dating back to the early development of the instrument. Initial efforts focused on the application of mechanical force between the surface and the tip. The ultimate resolution of mechanical manipulation with an STM probe was demonstrated by Eigler and Schweizer who were able to arrange individual xenon atoms to form the letters "IBM" on a nickel surface in a cryogenic vacuum chamber. When an STM tip is held in tunneling or field emission range, voltage pulses applied to the tip can induce surface changes in a non-contacting mode by various physical mechanisms, e.g., heating, material deposition, or field evaporation of material from the tip. Gas molecules ionized by the high electric field at the tip are accelerated toward the sample where they impact with sufficient kinetic energy to remove atoms from the first several atomic layers. The ability of the STM to modify surfaces has led to the investigation of the use of that technology for storing, reading, and writing bits of data.

Some of the storage methods explored to-date have been rewritable, but most have been write once. However, nearly all of the reported techniques have been extremely limited in their ability to write data (on the order of Kb/s) because detailed mechanical motion was required to create or detect bits.

The need therefore exists to construct the components necessary to build a microelectromechanical memory device, using standard fabrication techniques, which can achieve commercially viable storage capacities, i.e. 10 GB in a 1 centimeter by 1 centimeter by 0.2 centimeter volume. To achieve such a device, several problems must be overcome including the ability to precisely fabricate a cantilevered beam which can act as an STM probe. It is also necessary to overcome the problem of how the probe can be precisely positioned for read and write operations.

SUMMARY OF THE INVENTION

The present invention, in its broadest aspect, is directed to a microelectromechanical device which is comprised of a cantilevered beam positioned above, and free to move relative to, a substrate. The beam carries, according to one embodiment of the invention, a plurality of conductors which are insulated from one another. A tip is positioned on the beam in electrical contact with one of the conductors. A beam so constructed provides advantages not found in the prior art. By carrying a plurality of conductors, the conductor which is in electrical contact with the tip can be used for read/write operations. The remainder of the conductors may have a voltage impressed thereon so that the cantilevered beam can be positioned relative to fixed structures which may also have voltages applied thereto.

The present invention is also directed to a process of manufacturing such a microelectromechanical device. The process starts with a substrate which has been subjected to standard CMOS fabrication techniques so that it carries at least one metal layer forming the microelectromechanical device of interest, and at least one layer of oxide. The thus-fabricated device is subjected according to the process of the present invention to an anisotropic, or vertical, etching. The anisotropic etching etches all oxide not occluded by metal. That step provides very exact vertical sides to the various structures making up the device of interest. The anisotropic etching step is followed by a gas etching step for purposes of sacrificing the substrate. The gas etchant may be, for example, a fluoride gas such as $CF_4NO_2$. The width of various structures is controlled so that the cantilevered beam is released before the substrate under other structures is completely etched. The process of the present invention eliminates stiction and provides devices which are extremely well defined.

A microelectromechanical device constructed according to the teachings of the present invention may be used, for example, in the construction of a memory device. Such a memory device is comprised of a layer of media suitable for storing information. A cantilevered beam is positioned proximate to the layer of media, with the beam carrying at least one conductor. Devices for positioning the beam in x and y directions perpendicular to each other and parallel to the layer of media and in a z direction perpendicular to the layer of media are provided. A plurality of tips are positioned on the beam and in electrical contact with the conductors. A control circuit generates control signals input to the positioning devices for positioning the tips according to x, y, and z coordinates. A read/write circuit, which is in electrical communication with the conductor, provides signals to the tips to cause the tips to write those signals to the layer of media in a write mode and to read previously written signals sensed by the tips in a read mode.

If the beam carries a single conductor, it is necessary to multiplex the signals provided to the tips so that only one tip is responsive at a time. Such multiplexing can be accomplished by controlling the z coordinate of each tip. In an alternative embodiment, multiple conductors may be carried by the cantilevered beam, and wherein each tip is in electrical contact with one of the conductors. Under those circumstances, multiplexing is not necessary because each tip is responsive to a separate conductor. Under those circumstances, positioning in the z direction may be required only to maintain the proper distance between each of the tips and the layer of media.

A memory device constructed according to the teachings of the present invention, and using the novel microelectromechanical device of the present invention, should provide commercially viable storage capacities, i.e. 10 GB in a volume of 1 centimeter by 1 centimeter by 0.2 centimeters, access times on the order of one millisecond with data transfer rates in the read mode of 10 MB/s and data transfer rates in the write mode of 1 MB/s. Such a device, when active, should draw approximately 50 mW of power and, in a standby mode, approximately 1 mW of power. One reason such parameters are achievable is because each cantilevered beam moves over only a short distance. Therefore, less power is required. Another benefit of smaller beam movements is that less time is required to reach any particular stored record which, in addition to the fact that there is no rotational latency, results in a dramatic decrease in overall latency of access. Such parameters represent a revolutionary leap forward in volumetric density and power requirements of data storage systems for portable applications.

Fabrication using parallel lithography techniques offsets the additional cost of using three actuators, one for the x coordinate, one for the y coordinate, and one for the z coordinate, instead of simply one actuator. Using parallel lithographic fabrication techniques enables the economical manufacturing of large arrays which should ultimately result in dramatically lower data storage system costs as almost no manual mechanical assembly is required.

Finally, by appropriate coding of user data across a large array, the likelihood of unrecoverable data loss, i.e., the failure rate, can be made dramatically lower. More specifically, due to manufacturing defects, a few beams may fail initially. During operation, additional beams may fail. However, the ability of the system to continue to deliver data can be assured as long as an appropriate coding methodology is applied to the array. Those advantages, and other advantages and benefits of the present invention, will become apparent from the Detailed Description Of The Preferred Embodiments hereinbelow.

BRIEF DESCRIPTION OF THE DRAWINGS

For the present invention to be clearly understood and readily practiced, the present invention will be described in conjunction with the following figures wherein.

DETAILED DESCRIPTION OF THE PREFERRED EMBODIMENTS

Figure 1:
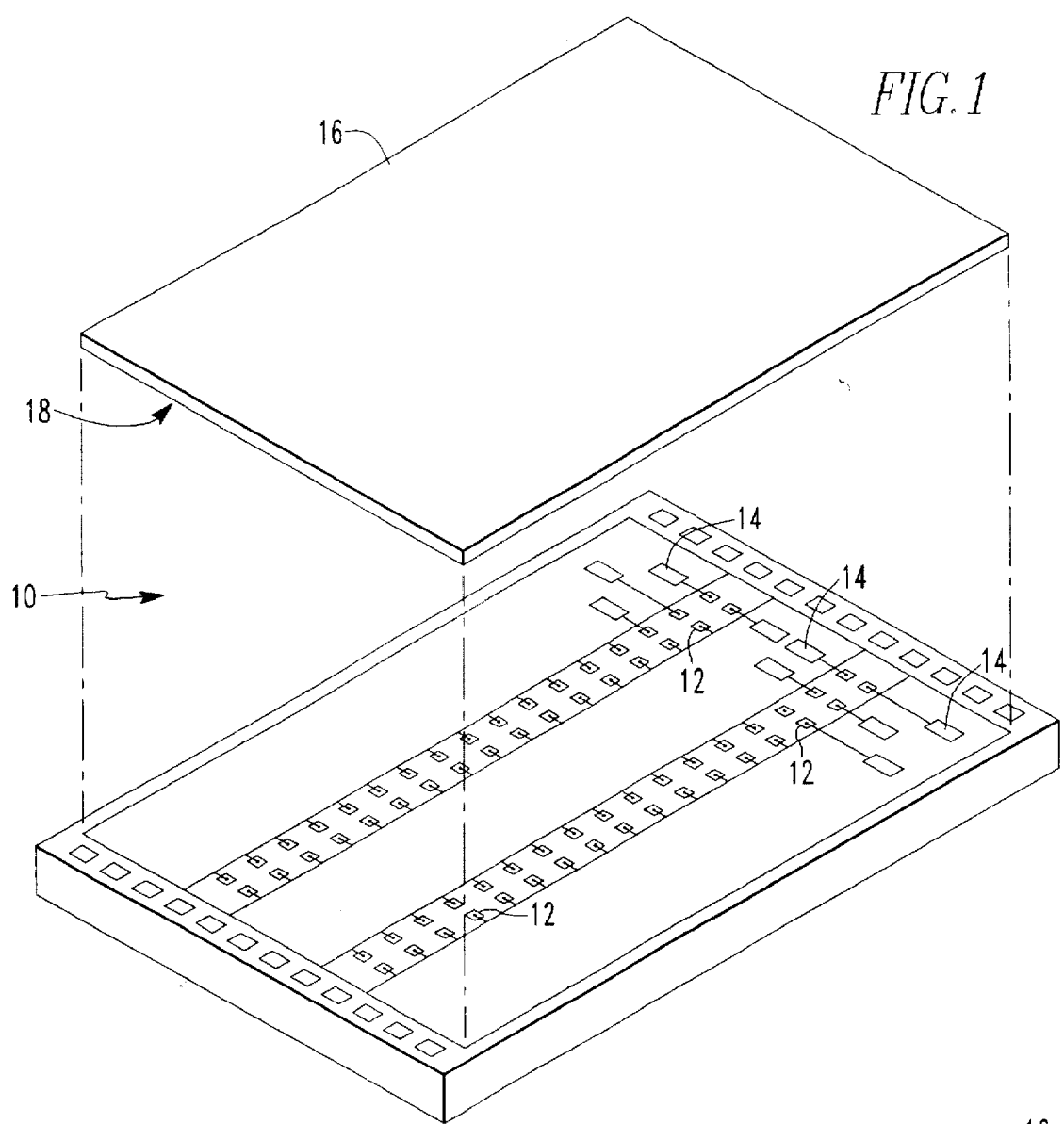
FIG. 1 illustrates a microelectromechanical memory device constructed according to the teachings of the present invention.

FIG. 1 illustrates a microelectromechanical memory device 10 constructed according to the teachings of the present invention. The microelectromechanical memory device 10 is constructed of an array of scanning tunneling microscopy (STM) devices 12. Each STM device 12 is connected to its own control electronics 14. The device 10 is also constructed of a layer of media 16 which is the physical structure which stores the data. It is the underside 18 of the layer of media 16 which is exposed to the array of STM devices 12.

Figure 2:
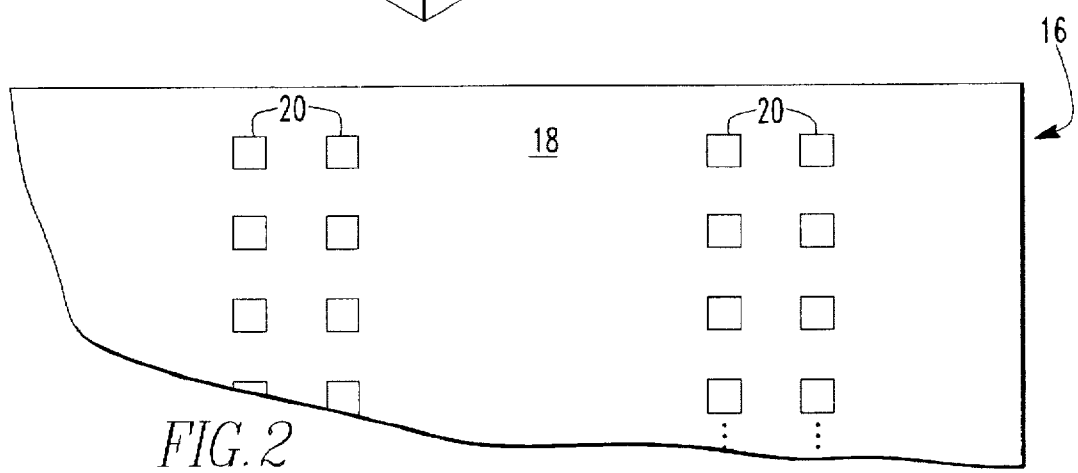
FIG. 2 illustrates a portion of the data storage layer.

FIG. 2 illustrates the underside 18 of a portion of the layer of media 16. The layer of media 16 may be, for example, a thin carbon film. The carbon film may be deposited by sputtering an initial crystal conformation. Each area 20 illustrated in FIG. 2 corresponds to an area which may be written or read by an STM device 12. It is seen that the ratio of areas 20 to the overall surface area of underside 18 is relatively small. By providing STM devices 12 which write to relatively small areas, little movement is required thereby allowing for fast write and read operations. Additionally, because little movement is required, power requirements are also kept to a minimum. However, because the areas 20 are relatively small, the data which is stored in each area 20 must be extremely compact. For example, a "pit" representing a logic level "one" is on the order of three to ten nanometers in diameter, with a spacing of three to ten nanometers between pits. It is that high density, coupled with the large number of areas 20, which should allow the storage capacity of the device 10 to reach 10 GB.

Figure 3:
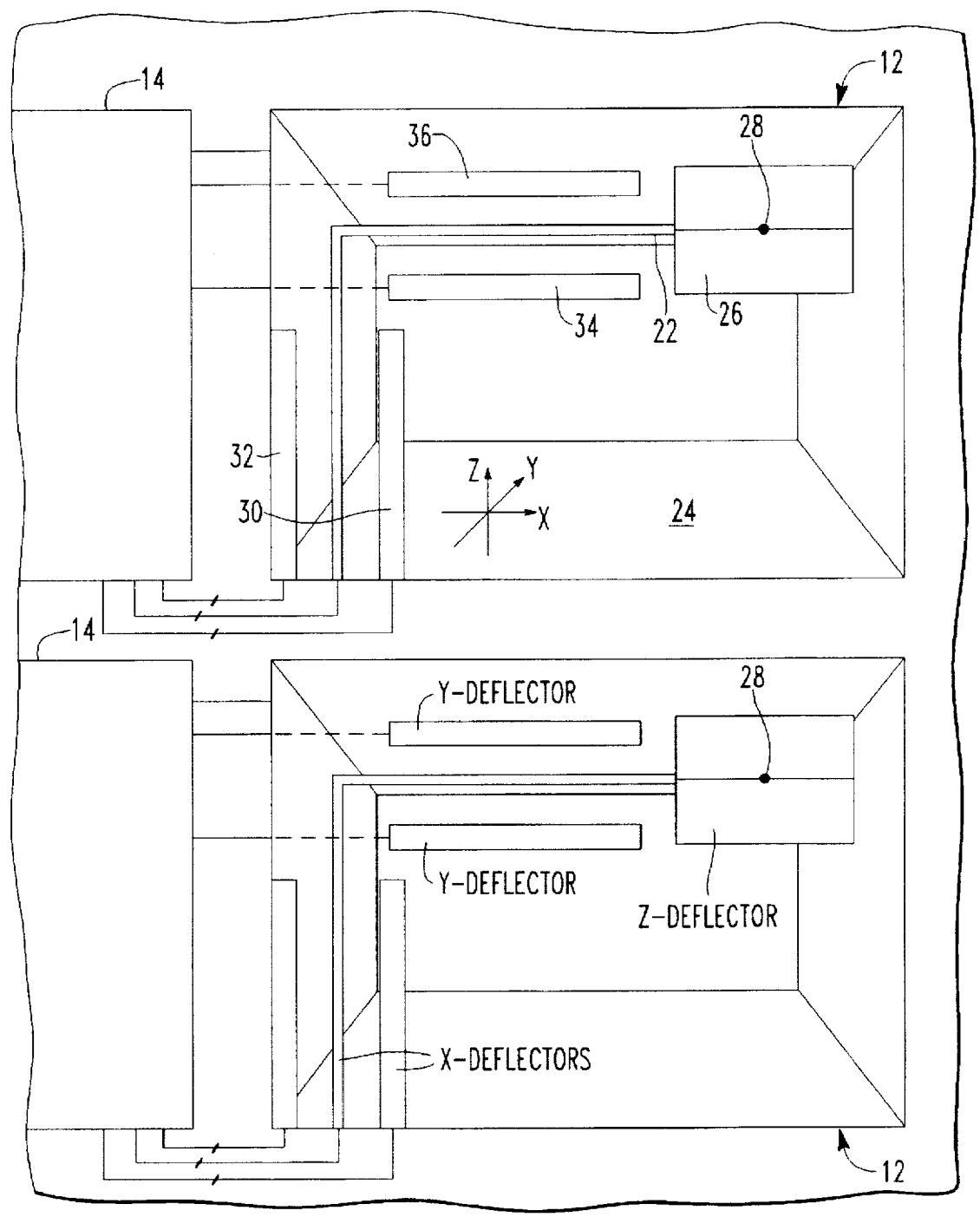
FIG. 3 illustrates two scanning tunneling microscopy (STM) devices constructed according to the teachings of the present invention.

Turning to FIG. 3, two STM devices 12 together with a portion of their respective control electronics 14 are illustrated. Each STM device 12 and its corresponding control electronics 14 is constructed and operates in an identical manner such that the description of the construction and operation of one STM device 12 and control electronics 14 is sufficient.

The STM device 12 is constructed of a cantilevered beam 22, which in the embodiment shown in FIG. 3, is substantially L-shaped. The beam 22 is positioned above a substrate 24. The beam 22 is free to move in x and y directions which are perpendicular to each other, but parallel to the substrate 24 and layer of media 16. The beam 22 is also free to move in a z direction which is perpendicular to both the substrate 24 and the layer of media 16. The beam carries a pad 26 at its distal end which is referred to herein as a z-deflector.

The beam 22 carries at least one metal conductor which is in electrical communication with a tip 28.

The position of the cantilevered beam 22 with respect to x coordinates is controlled by a pair of wall structures 30 and 32 which, under the control of electronics 14, may form a parallel plate capacitor which can urge cantilevered beam 22 either toward wall 32 or toward wall 30. In a similar fashion, a pair of wall structures 34 and 36 may, under the control of electronics 14, form a parallel plate capacitor for controlling the position of the beam 22, and hence the tip 28, with respect to y coordinates. As best shown in FIG. 1, control in the z direction can be achieved by applying a voltage to z deflector 26 with respect to the media 18 (best shown in FIG. 3) to urge the beam toward the media 18. In that manner, control electronics 14 can generate voltages to be applied to walls 30, 32, 34, and 36 as well as z deflector 26 to precisely position tip 28 with respect to x, y, and z coordinates, respectively.

The tip 28 is in electrical communication with control electronics 14 by virtue of the conductor running through or along beam 22. Thus, under the control of electronics 14, the beam 22 can be precisely positioned with respect to x, y, and z coordinates so that electrical signals may be supplied to the tip 28 for the signals to be written to the layer of media 16. In a read mode, the tip 28 is swept past a pre-determined portion of the layer of media 16 and the signals, in the form of ones and zeros, can be read by the tip 28.

The control electronics 14 used for controlling the position of beam 22 as well as the mode, write mode or read mode, of the STM device 12, are well known in the art and need not be described herein. The reader requiring more detail with respect to control electronics 14 is directed to: G. K. Fedder, *Simulation of Microelectromechanical Systems*, Ph.D. Thesis, Dept. of Electrical Engineering and Computer Science, University of California at Berkeley, Sept. 1994 and G. C. Fedder and R. T. Howe, *Integrated Testbed for Multi-Mode Digital Control of Suspended Microstructures*, Technical Digest, IEEE Solid-State Sensor and Actuator Workshop, Hilton Head Island, S.C., pp. 63–68, June 1992, which are hereby incorporated by reference.

Figure 4:
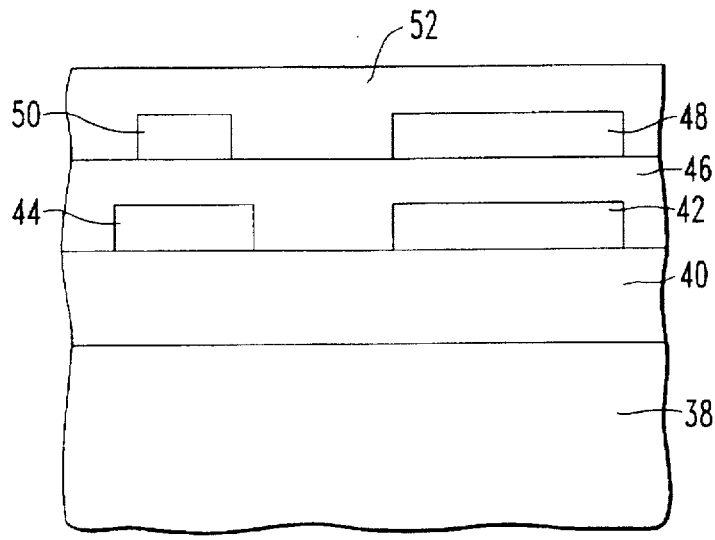
FIGS. 4, 5, and 6 illustrate the process of the present invention which may be used to manufacture the cantilevered beams of the present invention.
Figure 5:
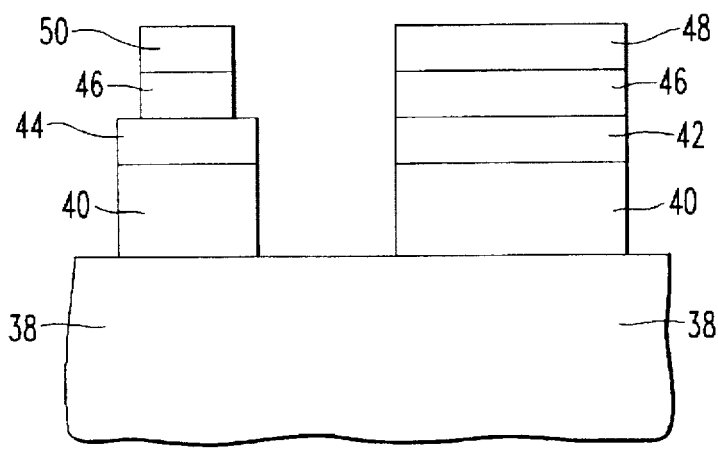
Figure 6:
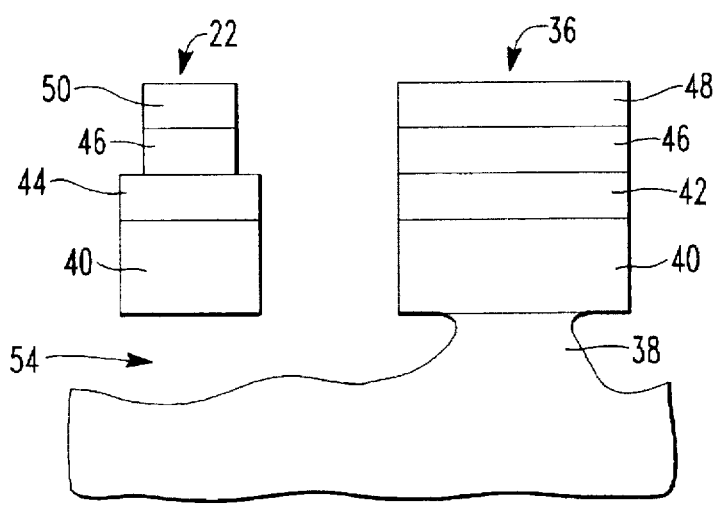

Turning to FIGS. 4, 5, and 6, a process is illustrated which may be used to manufacture the cantilevered beams 22 of the present invention as well as the entire STM device 12. In FIG. 4, I start with a substrate 38 upon which an erodible layer, such as an insulating layer, has been deposited. One example of such an insulating layer is oxide layer Thereafter, a non-erodible mask layer such as a conductive layer, for example, a metal layer, is laid down, which, after a masking and removal step, may result in metal areas 42 and The metal area 42 may ultimately form, for example, a portion of wall 36 while the metal area 44 becomes a conductor within beam 22.

Another insulating layer such as oxide layer 46 is laid down followed by another conductive layer such as a metal layer which is etched or otherwise removed to leave metal areas 48 and 50. Another insulating layer such as oxide layer 52 may be deposited.

It is significant that the process steps needed to construct the device illustrated in FIG. 4 are all standard CMOS process steps well known in the art. All that needs to be supplied is the appropriate masks needed to form arrays of STM devices 12 as well as to fabricate control electronics 14.

The substrate 38 carrying the oxide and metal layers is subjected to an anisotropic process which provides a vertical etch. As seen in FIG. 5, all oxide not occluded by metal is removed. In one embodiment of the present invention, we use a reactive ion etching technique in an oxygen-rich atmosphere. It may be desirable to step the metal layers so that it is possible, for example, for multiple tips carried by a cantilevered beam to be connected to individual conductors carried by the beam 22.

Finally, the substrate 38 is exposed to a gas etch which etches the substrate 38. The rate of etching is known and is controlled such that the beam 22 is freed from the substrate, but the etch is ended before wall 36 is completely undercut. In that manner, an array of STM devices 12 and control electronics 14 can be fabricated in a cost-effective manner using commercially available process steps.

Figure 7:
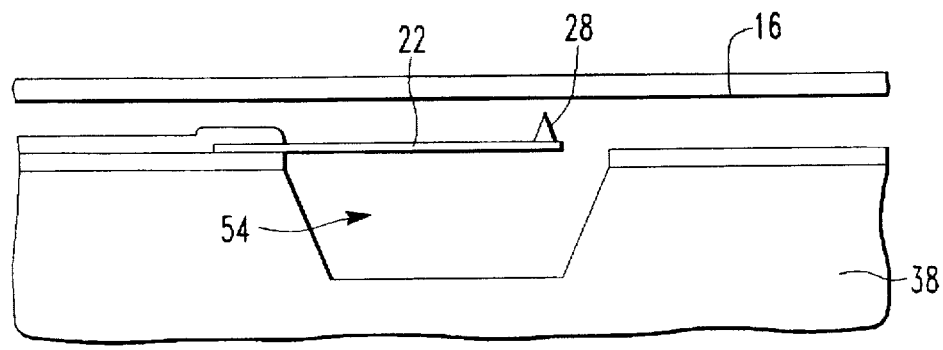
FIG. 7 is a simplified side view of a cantilevered beam positioned proximate to a data storage layer.

FIG. 7 is a simplified side view of a cantilevered beam 22 carrying tip 28 positioned proximate to the layer of media 16. An etch pit 54, also seen in FIG. 6, illustrates the beam's 22 freedom in the z direction.

It should be noted that technology is available for constructing tips 28. For example, it is known to sputter a metal through an oxide mask having a cavity formed therein. As the sputtered metal builds up from the bottom of the cavity, it also builds inward from the sides around the periphery of the cavity's opening causing the metal sputtered into the cavity to take the shape of a cone.

Figure 8:
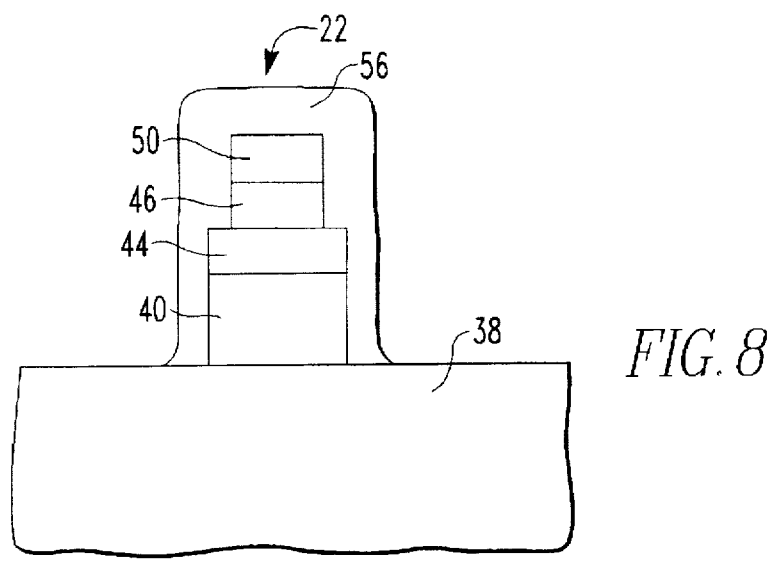
FIG. 8 is cross-sectional view of a cantilevered beam carrying a plurality of conductors.

FIG. 8 illustrates what will ultimately become the cantilevered beam 22, as seen in FIG. 5, after an insulating layer, such as oxide layer 56, has been deposited. The purpose for providing the oxide layer 56 is so that when multiple tips are used, each of the tips can be electronically isolated from the top conductor 50.

Figure 9:
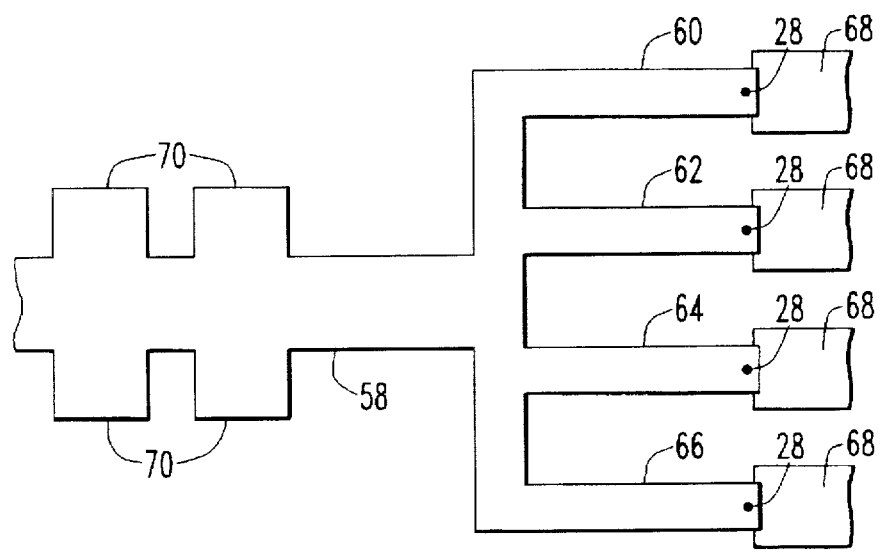
FIG. 9 is a top view of a cantilevered beam having a plurality of tips and having extensions for controlling the position of the beam in the z direction.

Another embodiment of the present invention is illustrated in FIG. 9. In FIG. 9 a beam 58 has four end portions 60, 62, 64, and 66, each carrying a tip 28. If the beam 58 has four separate conductors, the tips on the end of each of the arms 60, 62, 64, and 66 may each be responsive to one of the conductors. Under those circumstances, one of the conductors can be operative to cause one of the tips to be in the read/write mode whereas no signals need be carried by the other conductors. Alternatively, if beam 58 has a single conductor, then individual z deflectors 68 can be fabricated proximate to the end of each of the arms 60, 62, 64, and 66. Thus, when control electronics 14 sends a signal along the single conductor which places all of the tips 28 in the read/write mode, the z deflector 68 for, for example, arms 62, 64, and 66 may be used to bend those arms away from the layer of media 16 thereby leaving tip 28 on the end of arm 60 as the only tip physically close enough to carry out the read/write operation.

FIG. 9 also illustrates z deflector pads 70. z deflector pads 70 may be used in place of the large z deflector pad 26 illustrated in FIG. 3 in the event that the dimensions of the pad are such that walls 30, 32, 34, and 36 will be substantially undercut before z pad 26 is released from the substrate.

Figure 10:
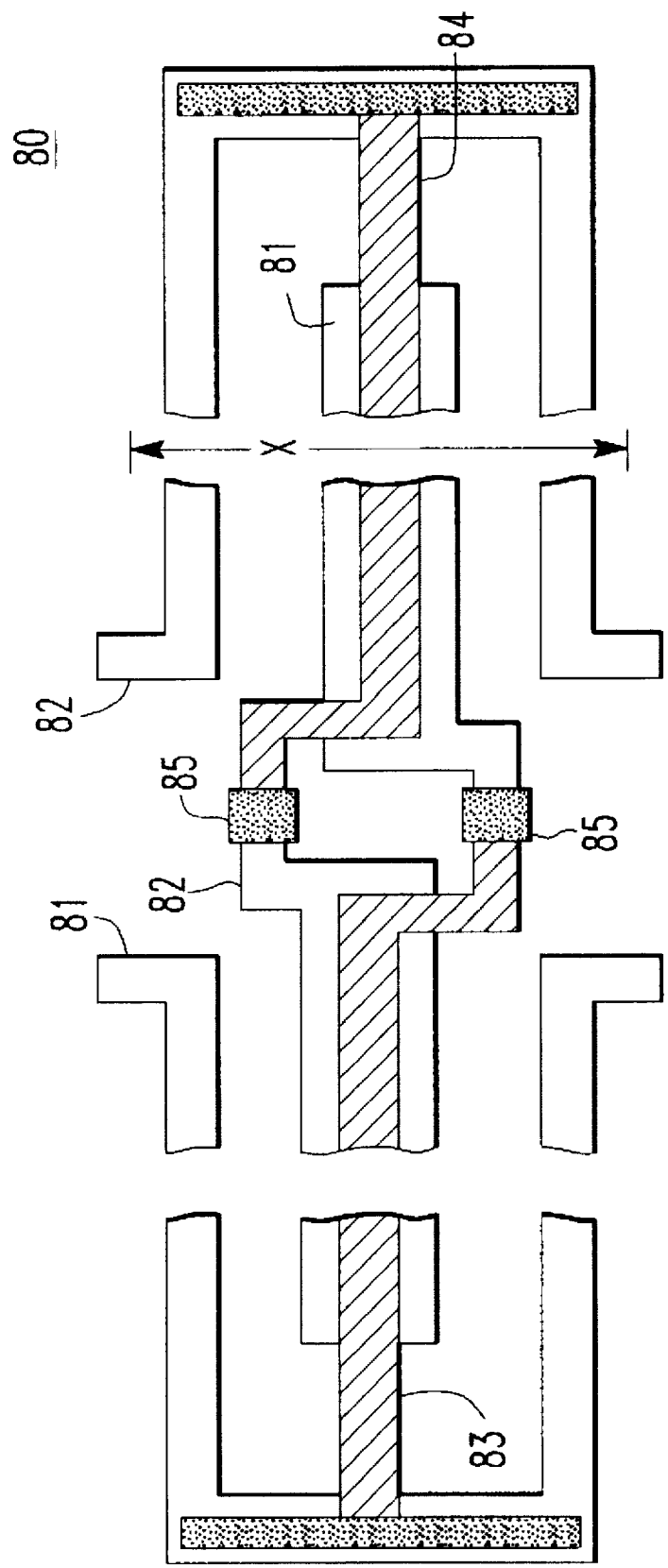
FIG. 10 illustrates a single segment of a self-contained bellows spring/actuator MEMS device incorporating multiconductor beams.

Another embodiment of the present invention is provided in FIG. 10, which illustrates a single segment 80 of a self-contained bellows spring/actuator MEMS device incorporating multiconductor beams. The spring lengths are not shown to scale in FIG. 10, as indicated by the broken lines. Segment 80 consists of two layers of conductors 81, 82 and 83. A potential difference between conductors 81 and 82 causes the height of the spring (measured along the direction indicated as X) to decrease. Layers 81 and 84 are separated by an insulator, as are layers 82 and 83. The black boxes indicate the only points at which two conductive layers connect electrically. Typically, many of these units would be stacked to achieve large (tens of microns) deflections.

The present invention offers substantial advantages over the prior art. For example, a memory device constructed according to the teachings of the present invention is substantially reduced in size and weight, and is approximately the thickness of one or two silicon wafers. Using the process of the present invention, complex three conductor beams can be fabricated. Additionally, the process steps of the present invention can "piggyback" on the best available CMOS lithography techniques. Using standard CMOS lithography techniques allows for inexpensive high volume fabrication.

The present invention has been described in conjunction with preferred embodiments thereof. However, those of ordinary skill in the art will recognize that many modifications and variations may be implemented. For example, the STM technology of the present invention, when used in conjunction with an amorphous magnetic tip, can write submicron magnetic bit patterns on double-layered magnetizable media. See Watanuki et al., "Small Magnetic Patterns Written With a Scanning Tunneling Microscope," IEEE Transactions on Magnetics, Volume 27, No. 6, November 1991. The foregoing disclosure and the following claims are intended to cover all such modifications and variations.

What I claimed is:

1. A process for fabricating a microelectromechanical device from a substrate carrying at least one layer of a non-erodible material laid out to form at least a portion of said microelectromechanical device and at least one layer of an erodible material, comprising the steps of:

using the layer of non-erodible material as a mask and anisotropically etching any of said layer of erodible material not occluded by said layer of non-erodible material; and gas etching said substrate to form a pit under at least a beam portion of said microelectromechanical device to free said beam portion of said microelectromechanical device from said substrate.

2. The process for fabricating a microelectromechanical device of claim 1 wherein said non-erodible material is a metal conductor and said erodible material is an insulator.

3. The process for fabricating a microelectromechanical device of claim 2 wherein said conductor is aluminum and said insulator is an oxide, and wherein said step of anisotropic etching includes the step of ion etching in an oxygen rich atmosphere.

4. The process for fabricating a microelectromechanical device of claim 3 wherein said step of gas etching includes the step of gas etching with a fluoride gas.

5. The process for fabricating a microelectromechanical device of claim 4 wherein said fluoride gas is $CF_4NO_2$.

6. A process for fabricating a microelectromechanical device from a substrate carrying at least one layer of a non-erodible conductive aluminum mask material laid out to form at least a portion of said microelectromechanical device and at least one layer of an erodible insulative oxide material, comprising the steps of:

anisotropic etching any of said layer of erodible material not occluded by said layer of non-erodible material using an ion etch in an oxygen rich atmosphere; and gas etching said substrate to form a pit under at least a beam portion of said microelectromechanical device to free said beam portion of said microelectromechanical device from the substrate.

7. The process of fabricating a microelectromechanical device of claim 6 wherein said step of gas etching includes the step of gas etching with a fluoride gas.

8. The process for fabricating a microelectromechanical device of claim 7 wherein said fluoride gas is $CF_4No_2$.

9. The process of claim 1 wherein said microelectromechanical device includes a positioning portion, and wherein said step of gas etching includes the step of gas etching for a period to time sufficient to etch a pit under said beam portion but insufficient to form a pit under said positioning portion.

* * * * *

UNITED STATES PATENT AND TRADEMARK OFFICE
CERTIFICATE OF CORRECTION

PATENT NO.    : 5,717,631
DATED         : February 10, 1998
INVENTOR(S)   : L. Richard Carley et al.

It is certified that error appears in the above-identified patent and that said Letters Patent is hereby corrected as shown below:

Column 1,
After line 7, insert the following:

-- STATEMENT REGARDING FEDERALLY SPONSORED RESEARCH
    The invention described herein was made with the support of the United States Government under DARPA Contract No. F30602-97-2-0323. The United States Government has certain rights in this invention. --

Signed and Sealed this

Thirteenth Day of April, 2004

JON W. DUDAS
*Acting Director of the United States Patent and Trademark Office*